United States Patent
Yen et al.

(10) Patent No.: US 9,473,173 B2
(45) Date of Patent: Oct. 18, 2016

(54) METHOD FOR EARLY TERMINATING DECODING PROCESSES OF SERIAL CONCATENATED CODING AND DECODER USING THE SAME

(71) Applicant: Storart Technology Co., Ltd., Hsinchu (TW)

(72) Inventors: Chih Nan Yen, Hsinchu (TW); Jui Hui Hung, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 120 days.

(21) Appl. No.: 14/193,018

(22) Filed: Feb. 28, 2014

(65) Prior Publication Data

US 2015/0249471 A1  Sep. 3, 2015

(51) Int. Cl.
*H03M 13/00* (2006.01)
*H03M 13/11* (2006.01)
*H03M 13/29* (2006.01)
*H03M 13/15* (2006.01)

(52) U.S. Cl.
CPC ..... *H03M 13/1105* (2013.01); *H03M 13/1128* (2013.01); *H03M 13/2906* (2013.01); *H03M 13/6502* (2013.01); *H03M 13/116* (2013.01); *H03M 13/152* (2013.01)

(58) Field of Classification Search
None
See application file for complete search history.

(56) References Cited

U.S. PATENT DOCUMENTS

| | | | |
|---|---|---|---|
| 7,966,543 B2* | 6/2011 | Hung | H03M 13/1122 714/752 |
| 8,732,564 B2* | 5/2014 | Chinnici | H03M 13/1111 714/752 |
| 8,769,380 B1* | 7/2014 | Burd | H03M 13/1128 714/774 |
| 8,938,660 B1* | 1/2015 | Varnica | H03M 13/00 714/755 |
| 2003/0110437 A1* | 6/2003 | Kim | G11B 20/1833 714/752 |
| 2009/0287983 A1* | 11/2009 | Truong | H03M 13/1575 714/785 |
| 2013/0031447 A1* | 1/2013 | Sharon | H03M 13/1128 714/785 |

* cited by examiner

*Primary Examiner* — Daniel McMahon
(74) *Attorney, Agent, or Firm* — Che-Yang Chen; Law Offices of Scott Warmuth (57) ABSTRACT

A method and decoder for early terminating decoding processes of serial concatenated coding are disclosed. The method includes the steps of providing a codeword, encoded by a first coding and a second coding sequentially; setting a maximum syndrome weight; decoding the second coding for the codeword by iterative calculations for syndromes; terminating decoding of the second coding if a number of the iterative calculations reaches a preset number or a syndrome weight of one iterative calculation is equal to or smaller than the maximum syndrome weight, otherwise repeating the decoding step and the terminating step; and decoding the first coding for the codeword.

9 Claims, 7 Drawing Sheets

METHOD FOR EARLY TERMINATING DECODING PROCESSES OF SERIAL CONCATENATED CODING AND DECODER USING THE SAME

FIELD OF THE INVENTION

The present invention relates to a method for decoding processes of serial concatenated coding and a decoder applying the method. More particularly, the present invention relates to a method for early terminating decoding processes of serial concatenated coding and a decoder applying the method.

BACKGROUND OF THE INVENTION

Low-Density Parity Check (LDPC) code can achieve performance close to Shannon bound. A m×n parity-check matrix H of a LDPC code is often represented by a bipartite graph, called Tanner graph, which is composed of n bit nodes $b_j$, j=1 to n, and in check nodes $c_i$, i=1 to m. Those bit nodes and check nodes are connected by edges defined by nonzero entries of the check matrix. The decoding performance of LDPC codes is very close to the Shannon limit, when it is operated with iterative message-passing (MP) (or belief propagation, BP) decoding algorithm and sufficiently long code lengths. The sum-product algorithm (SPA), a realization of the MP algorithm, has the best decoding performance among the existing MP-based algorithms.

One of the differences between conventional Error-Correction Codes (ECC) and LDPC codes is that the error-correction ability of LDPC codes is not proven. Thus, a phenomenon called "error floor" will be observed, which means the decoding performance in Bit-Error Ratio (BER) curve will not fall as quickly while the Signal-to-Noise Ratio (SNR) reaches a certain value. To solve this problem, one can concatenate a conventional ECC, e.g. Bose-Chaudhuri-Hocquenghem (BCH) code, after LDPC code but with lower code rate. This method is called serial concatenated coding.

Serial concatenated coding is a technique to combine several error correcting codes into a single one. In general, such a concatenated code can increase the error correcting capability dramatically. Conventionally, a serial concatenated coding employs one conventional ECC code as an outer encoding method and LDPC code as an inner encoding method to obtain a codeword encoded by the two methods sequentially. This coding scheme has several advantages from its powerful correcting capability. For example, due to the systematic characteristics, decoding complexity is often not large. Furthermore, the data read operation can be directly performed by the outer BCH code decoder if the quality of read channel is good. Only when the outer code decoding fails, the inner LDPC code decoder is activated to produce more reliable estimates of the original data.

Figure 1:
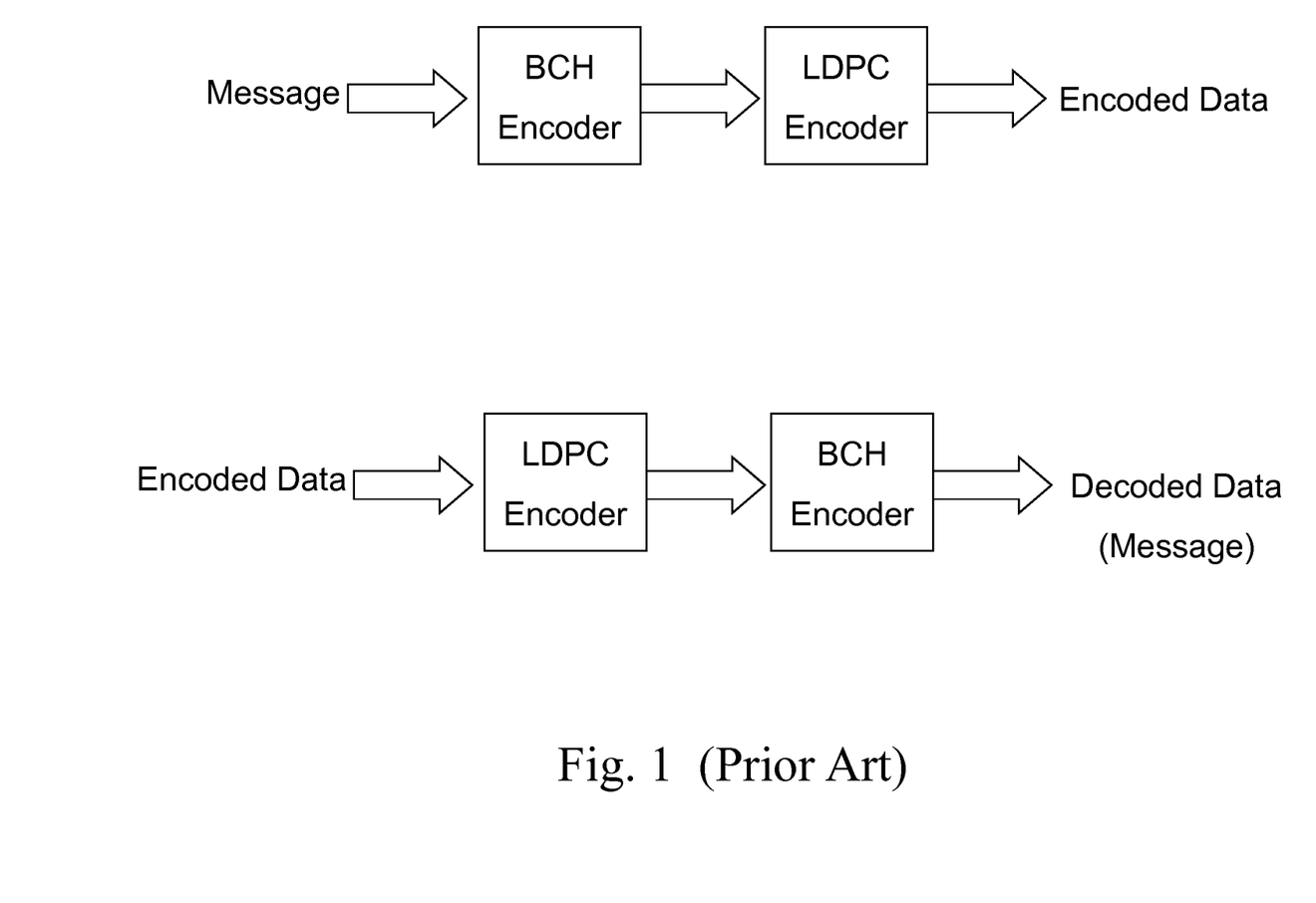
FIG. 1 shows encoding and decoding processes of a conventional serial concatenated coding.

The encoding and decoding flow chart of serial concatenated coding is shown in FIG. 1. A message is encoded by BCH code first, and then a LDPC code follows. Conversely, the encoded data will be passed to LDPC and then BCH decoders for decoding.

Figure 2:
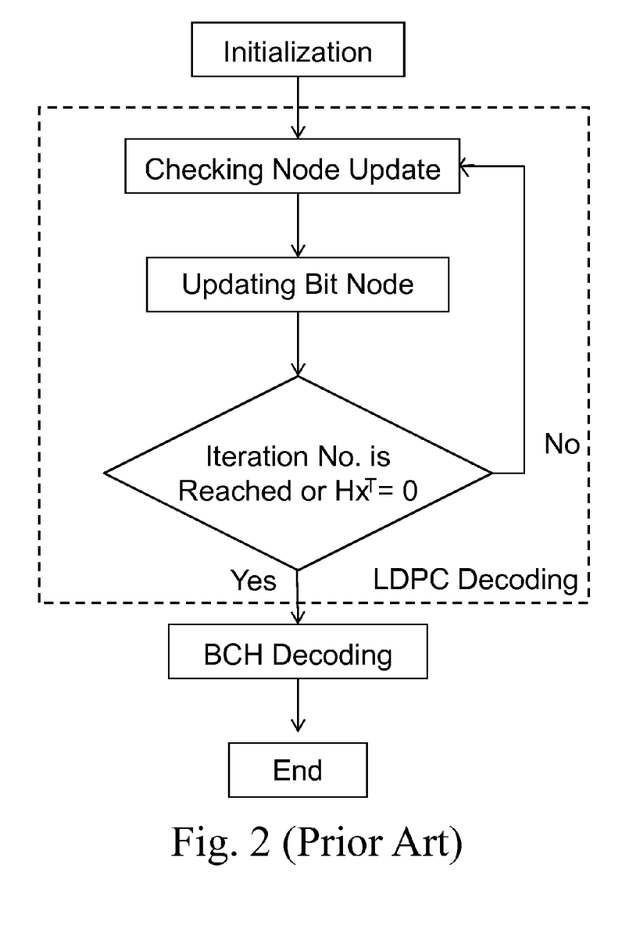
FIG. 2 is a flow chart of the decoding process of the conventional serial concatenated coding.

Please see FIG. 2. FIG. 2 shows a decoding procedure of the LDPC and BCH concatenated coding. This figure shows the conventional decoding process (enclosed by dashed-line) of a LDPC code and the additional BCH decoding process. Conventional LDPC decoding processes involve back-and-forth message update iterations between check nodes and bit nodes. The decoded bits are output when the decoded information bits satisfy the zero syndrome vector constraint, or when the iteration number exceeds a maximum number. x denotes the decoded codeword in row vector form in FIG. 2. The iterative decoding of LDPC code will be finished until the maximal iteration count is reached or syndrome test is passed. After that, BCH decoding procedure can be started. As one can see, the executing time of the decoding procedure of LDPC and BCH concatenated coding will be larger than only LDPC decoding is processed so as to reduce the decoding throughput. Therefore, a suitable method to shorten the executing time for decoding serial concatenated coding is necessary.

SUMMARY OF THE INVENTION

As mentioned above, the executing time of the decoding procedure serial concatenated coding is larger than that of decoding processes for one coding only. Therefore, a suitable method to shorten the executing time for decoding serial concatenated coding and enlarge the decoding throughput is necessary.

According to an aspect of the present invention, a method for early terminating decoding processes of a codeword coded by serial concatenated coding includes the steps of: A. providing a codeword, encoded by a first coding and a second coding sequentially, wherein decoding of the second coding needs iterative calculations for syndromes; B. setting a maximum syndrome weight; C. processing decoding of the second coding for the codeword; D. terminating decoding of the second coding if a number of the iterative calculations reaches a preset number or a syndrome weight of one iterative calculation is equal to or smaller than the maximum syndrome weight, otherwise repeating step C to step D; and E. decoding the first coding for the codeword. The syndrome weight is the number of the syndromes and updated after step C is completed.

Preferably, step C further includes the steps of: C1. checking node updating for the codeword by a parity check matrix; C2. processing syndrome calculating; and C3. updating bit nodes for the codeword. Step C2 generates a syndrome weight.

In practice, the first coding is a convolutional code, a block code or turbo code. The block code is Bose-Chaudhuri-Hocquenghem (BCH) code, Quasi-Cyclic Low-Density Parity Check (QC-LDPC) code, Low-Density Parity Check (LDPC) code, Hamming code, Reed-Solomon (RS) code or Quadratic Residue (QR) code. The second coding is QC-LDPC code or LDPC code.

According to an aspect of the present invention, a decoder for early terminating decoding processes of a codeword coded by serial concatenated coding, includes an inner decoding module, receiving a codeword, encoded by a first coding and a second coding sequentially, for processing decoding of the second coding for the codeword and sending a treated codeword including: a decoding circuit, for checking node updating for the codeword by a parity check matrix and updating bit nodes for the codeword iteratively until a number of iteration thereof reaches a preset number; and a syndrome weight checking circuit, for checking a syndrome weight after the decoding circuit checks node updating for the codeword, and terminating decoding of the second coding when the syndrome weight is equal to or smaller than a maximum syndrome weight and keeping current form of the codeword as the treated codeword; and an outer decoding module, linked to the inner decoding module, for receiving the treated codeword and processing decoding of the first coding for the treated codeword. Decoding of the second coding needs iterative calculations for syndromes and the syndrome weight is the number of the syndromes.

Time for decoding processes can be reduced since the second coding would not be decoded completed before the decoding processes for the first coding begins.

DETAILED DESCRIPTION OF THE PREFERRED EMBODIMENTS

The present invention will now be described more specifically with reference to the following embodiments.

Figure 3:
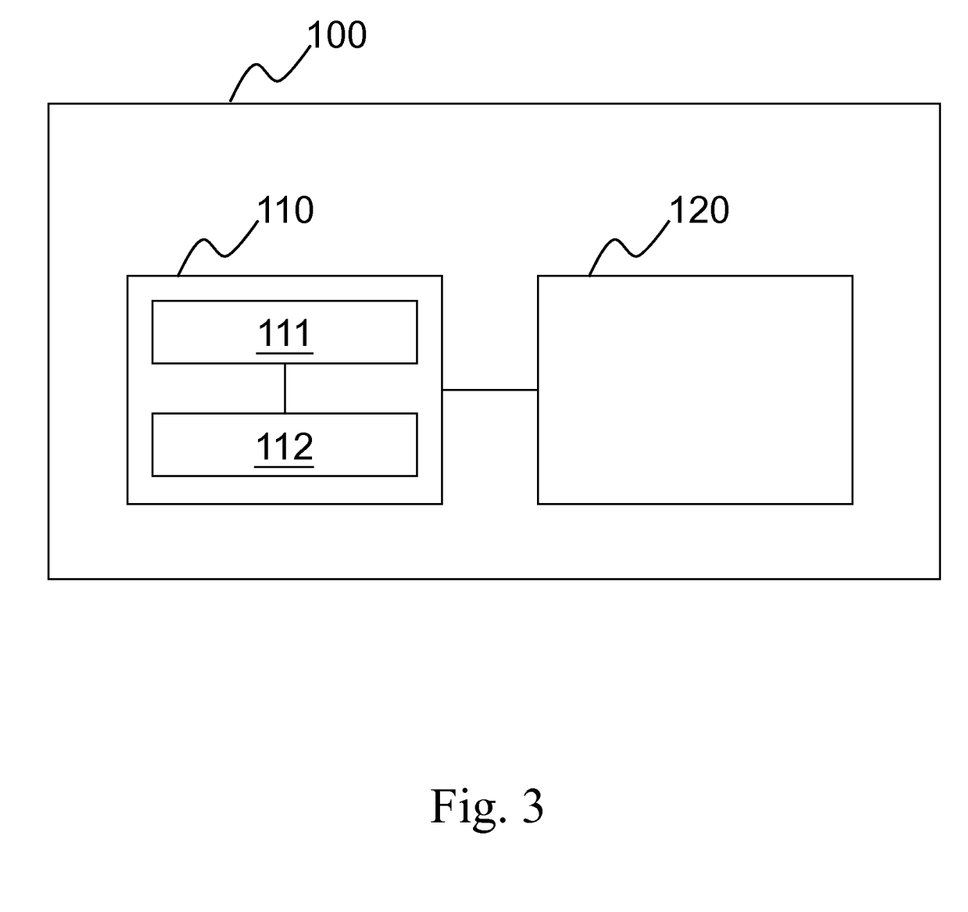
FIG. 3 shows a decoder according to the present invention.

Please refer to FIG. 3. An embodiment is illustrated. A decoder 100 according to the present embodiment is shown. The decoder 100 is able to terminate decoding processes of a codeword coded by serial concatenated coding in an early stage comparing with conventional decoders. The decoder 100 includes two major parts: an inner decoding module 110 and an outer decoding module 120. For the codeword encoded by a first coding and a second coding sequentially, the inner decoding module 110 is used to decode the second coding for the codeword and the outer decoding module is used to decode the first coding for the codeword. In this embodiment, the first coding adopts Bose-Chaudhuri-Hocquenghem (BCH) code. The second coding is Low-Density Parity Check (LDPC) code.

Functions of the inner decoding module 110 are to receive the codeword and process decoding of the second coding for the codeword and send a treated codeword. The treated codeword will be defined later. The inner decoding module 110 further has a decoding circuit 111 and a syndrome weight checking circuit 112. The decoding circuit 111 can check node updating for the codeword by a parity check matrix and update bit nodes for the codeword. Processes of checking node updating and updating bit nodes are iteratively calculated. These two processes are often used in conventional decoding methods for LDPC or QC-LDPC code. Similarly, the processes terminate or decoding finishes until a number of iterative calculations of the processes reaches a preset number. Usually, when the number of iterations of the processes exceeds the preset number, an encoded codeword has been decoded or the corrected codeword will not be changed in further iterations. Decisions of the preset number are different in different decoders formed by different parity check matrix and belong to an application of prior art. It is not further described.

One of the features of the present invention is to check a syndrome weight between processes of checking node updating and updating bit nodes. It is done by the syndrome weight checking circuit 112. When one syndrome weight is available, it is used to check if the decoding processes of the second coding can be terminated earlier, not being carried out perfectly. It relates to another feature of the present invention. A maximum syndrome weight is preset in the syndrome weight checking circuit 112. When the syndrome weight checked by the syndrome weight checking circuit 112 is equal to or smaller than the maximum syndrome weight. Then, the syndrome weight checking circuit 112 will keep the current form of the codeword as the treated codeword. It means the second coding not completely decoded. However, since the main purpose of the first coding is to eliminate the residual errors left in the second coding, the treated codeword can be further decoded and corrected after decoding processes of the first coding are done. The original message can be available but decoding time is reduced. In order to have a better understanding of how the terminating processes work, an example is illustrated in FIG. 5 and FIG. 6.

Figure 5:
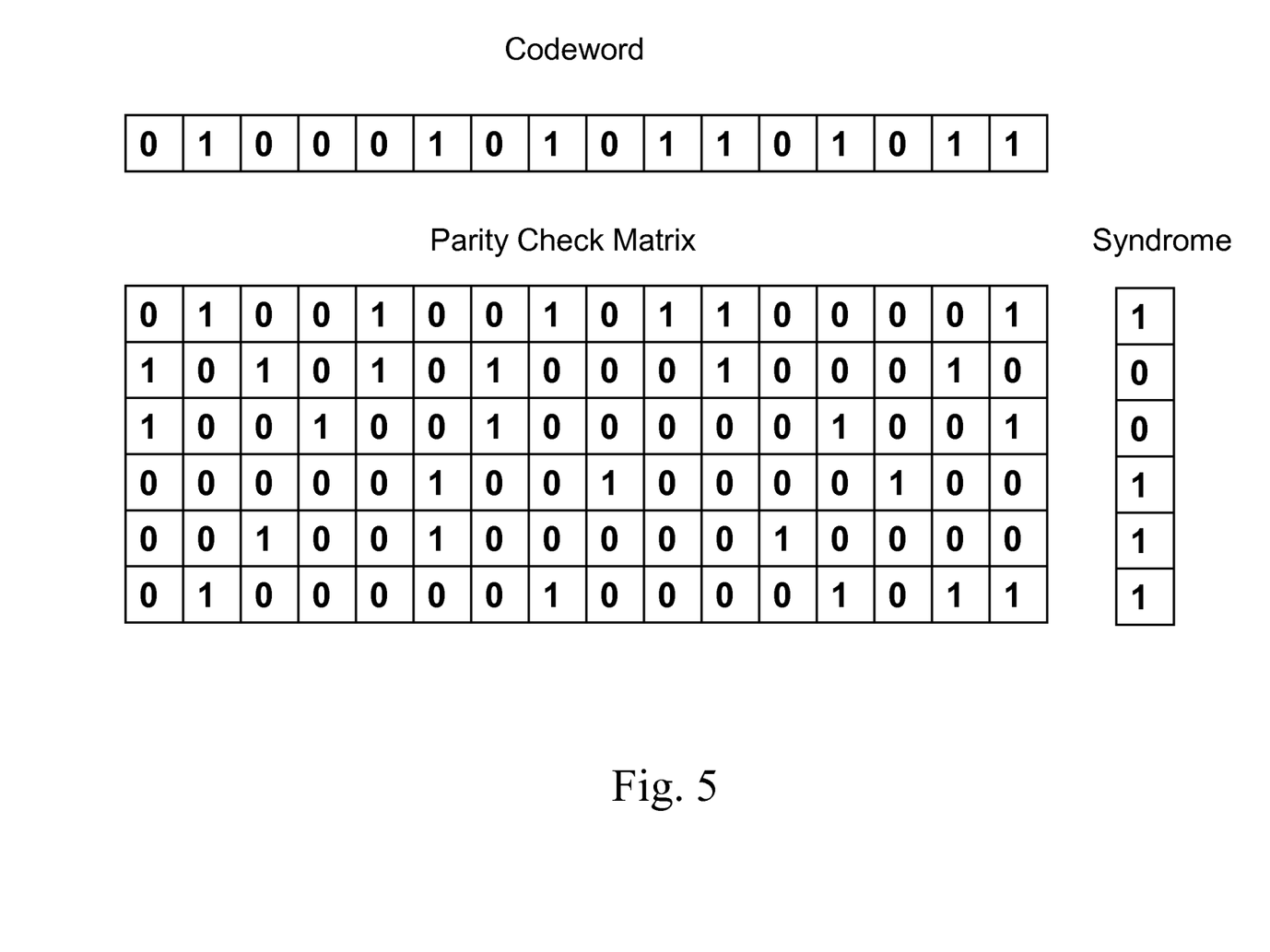
FIG. 5 illustrates a syndrome obtained by a codeword and a corresponding parity check matrix.
Figure 6:
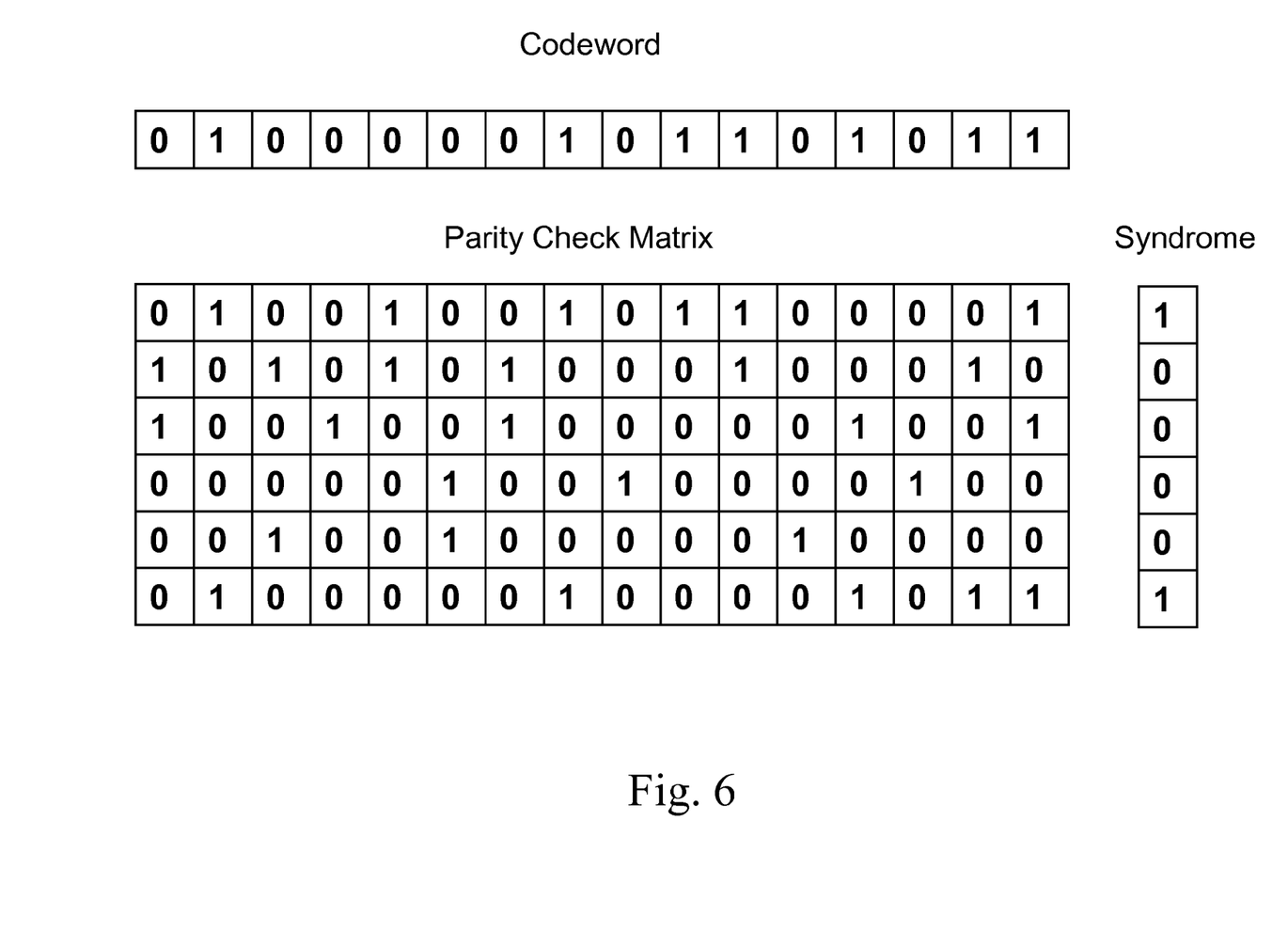
FIG. 6 illustrates another syndrome obtained by the codeword and the corresponding parity check matrix.

As shown in FIG. 5, a codeword is under decoding by using a parity check matrix. In one iterative operation, the codeword is corrected as "0100010101101011". The corresponding syndrome is "100111". Therefore, the syndrome weight is 4. If the maximum syndrome weight is set to be 3, the decoding processes need to iterative calculated again. Here, the syndrome weight is the number of the syndromes. It is obvious that the $6^{th}$ and $8^{th}$ bit are flipped. Please see FIG. 6. After updating bit nodes, the codeword may be changed to "0100000101101011". Now, only the $8^{th}$ bit is an error and the corresponding syndrome weight drops to 2. For conventional decoding methods for LDPC or QC-LDPC code, the processes need to keep going until a preset number meets or the syndrome weight is zero. However, the present invention terminates iterative calculations earlier and leaves the error to be treated in the decoding processes of the first coding. It should be noticed that the value of the maximum syndrome weight should be derived according to the correction ability of the concatenated coding (BCH code) and the average degree of check nodes of a Tanner graph. A best one can be found by simulation under specified channel condition. Please take note that, in practice, the codeword may be more than 10,000 bits and the parity check matrix is significantly huge. The 6×16 parity check matrix is used for illustration purpose, rather than limiting the present invention.

The outer decoding module 120 is linked to the inner decoding module 110. It can receive the treated codeword and processing decoding of the first coding for the treated codeword. After the decoding processes of the first coding finishes, the decoding of the codeword also finishes.

Figure 4:
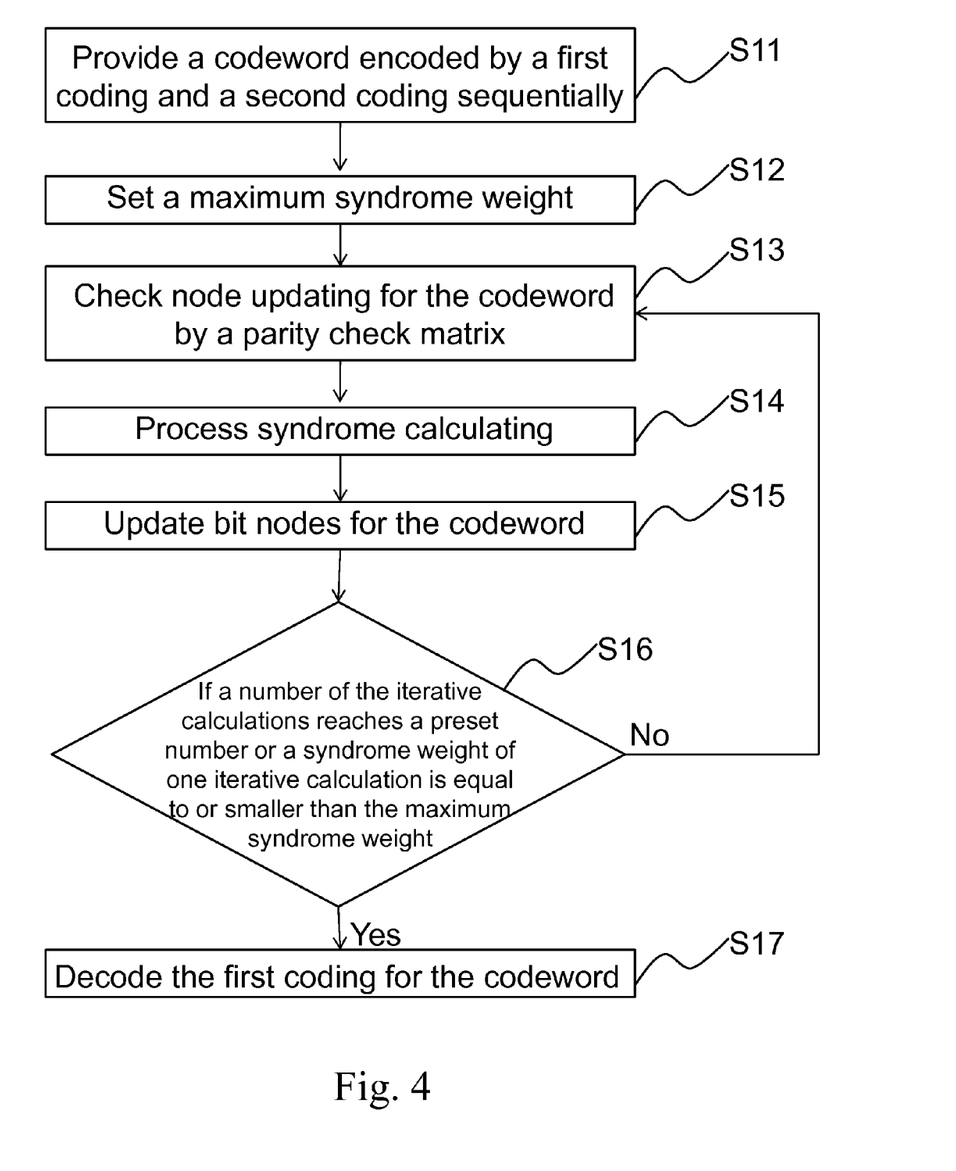
FIG. 4 is a flow chart of a decoding process according to the present invention.

Operation of the codeword by using the decoder 100 is summarized in FIG. 4. First, provide the codeword which was encoded by the first coding and the second coding sequentially to the decoder 100 (S11). Then, before decoding processes of the second coding begins, set the maximum syndrome weight for the syndrome weight checking circuit 112 (S12). Of course, the maximum syndrome weight can be set along with manufacturing of the encoder 100. The key point is to make sure the maximum syndrome weight is successfully stored in the syndrome weight checking circuit 112. After S12, the inner decoding module 111 initiates decoding processes of the second coding. The inner decoding module 111 first checks node updating for the codeword by a parity check matrix (S13). Then, the syndrome weight checking circuit 112 processes syndrome calculating and generates a syndrome weight (S14). The inner decoding module 111 keeps updating bit nodes for the codeword (S15). At this stage, a judgment should be done by the syndrome weight checking circuit 112. If a number of the iterative calculations reaches a preset number or one syndrome weight of one iterative calculation is equal to or smaller than the maximum syndrome weight, decoding of the second coding is terminated; otherwise, the inner decoding module 111 repeats S13 to S16 (S16). Finally, the outer decoding module 120 decodes the first coding for the codeword (S17).

Figure 7:
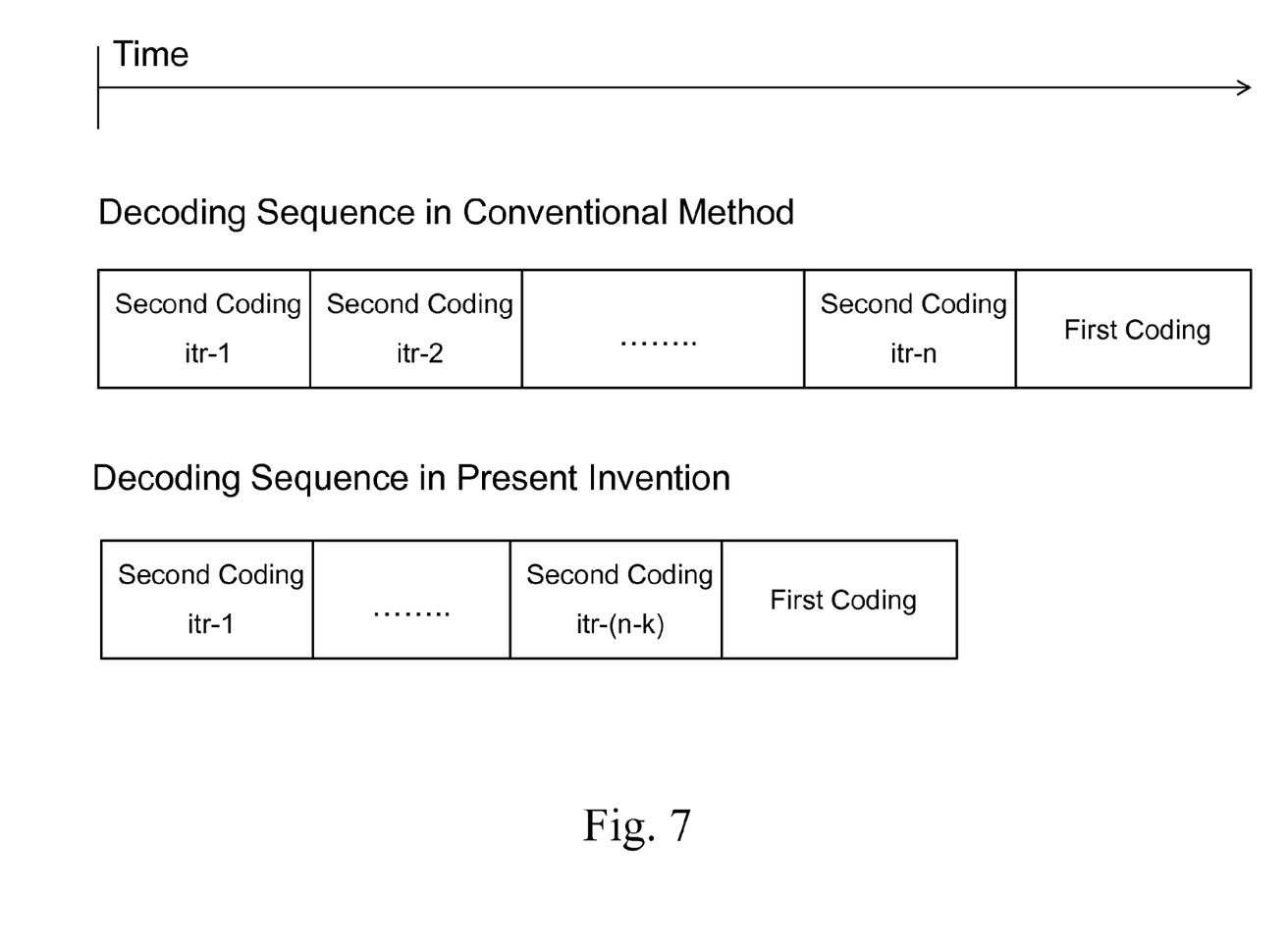
FIG. 7 illustrates an advantage of the present invention comparing with the conventional method.

Please see FIG. 7. It illustrates an advantage of the present invention comparing with the conventional method. When the conventional method is applied, decoding sequence will take decoding the second coding iteratively in a first calculation, a second calculation . . . to an $n^{th}$ calculation where a preset number of iterative calculations is met. Then, decoding of processes of the first coding begins. However, according to the present invention, the decoding sequence will take decoding the second coding iteratively in a first calculation, a second calculation . . . to an $(n-k)^{th}$ calculation before decoding of processes of the first coding begins. Therefore, time of k sequences of iterative calculation is saved. Numerical k could be any integer smaller than n.

It is emphasized that the second coding needs iterative calculations for syndromes. Hence, as mentioned above, it is better to used LDPC or QC-LDPC code. However, the choice of the first coding is not so limited. In this embodiment, it is BCH code. In other embodiments, it can be any convolutional code, block code or turbo code. Preferably, the block code is recommended. So, besides BCH code, Quasi-Cyclic Low-Density Parity Check (QC-LDPC) code, Low-Density Parity Check (LDPC) code, Hamming code, Reed-Solomon (RS) code or Quadratic Residue (QR) code is a possible option.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for early terminating decoding processes of a codeword coded by serial concatenated coding, comprising the steps of:
   A. providing a codeword, encoded by a first coding and a second coding sequentially;
   B. setting a maximum syndrome weight;
   C. decoding the second coding for the codeword by iterative calculations for syndromes;
   D. terminating decoding of the second coding if a syndrome weight of one iterative calculation is equal to or smaller than the maximum syndrome weight, otherwise repeating step C to step D; and
   E. decoding the first coding for the codeword,
   wherein the syndrome is a binary number which includes a plurality of "0" and "1"; and
   wherein the syndrome weight is an amount of "1" in the syndromes and updated after step C is completed.

2. The method according to claim 1, wherein step C comprises the steps of:
   C1. checking node updating for the codeword by a parity check matrix;
   C2. performing syndrome calculation to obtain the syndrome weight; and
   C3. updating bit nodes for the codeword.

3. The method according to claim 1, wherein the first coding is a convolutional code or turbo code.

4. The method according to claim 1, wherein the first coding is a block code comprising Bose-Chaudhuri-Hocquenghem (BCH) code, Quasi-Cyclic Low-Density Parity Check (QC-LDPC) code, Low-Density Parity Check (LDPC) code, Hamming code, Reed-Solomon (RS) code or Quadratic Residue (QR) code.

5. The method according to claim 1, wherein the second coding is QC-LDPC code or LDPC code.

6. A decoder for early terminating decoding processes of a codeword coded by serial concatenated coding, the decoder comprising:
   an inner decoding module, receiving a codeword, encoded by a first coding and a second coding sequentially, for decoding the second coding for the codeword and sending a treated codeword, comprising:
      a decoding circuit, for checking whether bit nodes of the codeword is updated by a parity check matrix and updating bit nodes for the codeword iteratively until a number of iterative calculation thereof reaches a preset number; and
      a syndrome weight checking circuit, for checking a syndrome weight after the decoding circuit checks node updating for the codeword, and terminating decoding of the second coding when the syndrome weight is equal to or smaller than a maximum syndrome weight and keeping current form of the codeword as the treated codeword; and
   an outer decoding module, linked to the inner decoding module, for receiving the treated codeword and processing decoding of the first coding for the treated codeword,
   wherein the syndrome is a binary number which includes a plurality of "0" and "1"; and
   wherein decoding of the second coding needs iterative calculations for syndromes and the syndrome weight is an amount of "1" in the syndromes.

7. The decoder according to claim 6, wherein the first coding is a convolutional code or turbo code.

8. The decoder according to claim 6, wherein the first coding is a block code comprising Bose-Chaudhuri-Hocquenghem (BCH) code, Quasi-Cyclic Low-Density Parity Check (QC-LDPC) code, Low-Density Parity Check (LDPC) code, Hamming code, Reed-Solomon (RS) code or Quadratic Residue (QR) code.

9. The decoder according to claim 6, wherein the second coding is QC-LDPC code or LDPC code.

* * * * *